United States Patent [19]
Nakashima et al.

[11] Patent Number: 5,745,194
[45] Date of Patent: Apr. 28, 1998

[54] ACTIVE MATRIX LCD APPARATUS WITH COMPENSATING CAPACITOR HAVING A PARTICULAR FEATURE

[75] Inventors: Kohji Nakashima; Osamu Sukegawa, both of Tokyo, Japan

[73] Assignee: NEC Corporation, Tokyo, Japan

[21] Appl. No.: 496,168

[22] Filed: Jun. 28, 1995

[30] Foreign Application Priority Data

Jun. 28, 1994 [JP] Japan ..................... 6-167488

[51] Int. Cl.$^6$ ..................... G02F 1/1343; G02F 1/136
[52] U.S. Cl. ..................... 349/38; 349/39; 349/44
[58] Field of Search .................... 359/59, 57; 349/38, 349/39, 44

[56] References Cited

U.S. PATENT DOCUMENTS

| | | | |
|---|---|---|---|
| 5,151,806 | 9/1992 | Kawamoto et al. | 359/59 |
| 5,285,302 | 2/1994 | Wu | 359/59 |
| 5,528,395 | 6/1996 | So | 349/42 |

FOREIGN PATENT DOCUMENTS

| | | |
|---|---|---|
| 0288011 | 10/1988 | European Pat. Off. . |
| 62-172758 | 7/1987 | Japan . |
| 63-276031 | 11/1988 | Japan . |
| 64-42634 | 2/1989 | Japan . |
| 3-123320 | 5/1991 | Japan . |
| 3-141325 | 6/1991 | Japan . |
| 4-86809 | 3/1992 | Japan . |

OTHER PUBLICATIONS

Patent Abstracts of Japan, vol. 013, No. 093 (P-838), Mar. 6, 1989.

*Primary Examiner*—William L. Sikes
*Assistant Examiner*—Toan Ton
*Attorney, Agent, or Firm*—Sughrue, Mion, Zinn, Macpeak & Seas, PLLC

[57] ABSTRACT

In an active matrix liquid-crystal display apparatus, in order to increase display quality, compensator capacitance is provided to compensate pixel voltage fluctuation resulted from increase of parasitic capacitance caused by light shield film. A capacitance film is fabricated between a pixel electrode and the adjacent image signal line to provide compensator capacitance. Signals are supplied to each image signal line that a positive electric voltage and a negative electric voltage are applied to the liquid-crystal layer of the adjacent pixels along the scan signal line, alternately from pixels to pixels. The compensator capacitance is set to approximately the same as parasitic capacitance caused by the light shield film so that modulation noise caused by the light shield film is offset by modulation noise caused by the compensator capacitance when the adjacent image signal line is in opposite phase. Thus the voltage fluctuation of the pixel electrode can be compensated.

1 Claim, 4 Drawing Sheets

ACTIVE MATRIX LCD APPARATUS WITH COMPENSATING CAPACITOR HAVING A PARTICULAR FEATURE

BACKGROUND OF THE INVENTION

1. Field of the Invention

The present invention relates to a liquid-crystal display apparatus which uses amorphous silicon thin-film transistors and, more particularly, to a liquid-crystal display which compensates parasitic capacitance caused by light shield film.

2. Description of the Prior Art

As shown in FIG. 2, a conventional liquid-crystal display apparatus controls a state of liquid crystal 130 by applying an electric field between a pixel electrode 106 on a glass substrate 100 and a counter electrode 121 on a glass substrate 120 to turn "on" and "off" light through the liquid crystal 130.

A conventional fabrication of a liquid-crystal display apparatus is shown in FIG. 2. A gate electrode 101 is patterned on the glass substrate 100, then a gate insulating film 114 and a semiconductor film 102 are formed in this order. Then, a drain electrode 103, a source electrode 104, an image signal line 113, and a pixel electrode 106 are formed on them. Then a passivation film 115 and a light shield film 105 are added to complete a thin-film transistor (TFT) substrate. The semiconductor film 102 is made of, for example, amorphous silicon hydride (a-Si:H), which can be formed on a glass substrate at relatively low temperatures, 300° C. or so.

The counter substrate is fabricated by forming a counter electrode 121 on the glass substrate 120.

Finally, the TFT substrate and the counter substrate are coated with orientations films (not shown), then, orientation treatment is applied to them. After seal patterns are formed, the substrates are put together, burnt, then liquid crystal 130 is poured between them. They are then sealed to complete a liquid-crystal display device.

Polarizers, driving circuits, and a package are added to the liquid-crystal display device to complete a liquid-crystal display apparatus.

The liquid-crystal display device contains a black matrix layer, which is not shown in the figure, on the counter substrate or the TFT substrate in order to improve display quality.

In FIG. 1, the gate electrode 101 in FIG. 2 is indicated as a gate electrode 1 and the scan signal line 11 and the drain electrode 103 in FIG. 2 are indicated as a drain electrode 3 and an image signal line 12, according to their function. That is, as shown in FIG. 1, the scan signal line 11 and the image signal line 12 are patterned to cross each other and insulated from each other. A TFT is placed on the crossover point. The scan signal line 11 is connected to the gate electrode 1 and the image signal line 12 is connected to the drain electrode 3. In FIG. 1, which is a part of a plan view of the liquid-crystal display apparatus, semiconductor film 2, a drain electrode 3, a source electrode 4, a light block film 5, a pixel electrode 6, and a next image signal line 13 are shown. Remaining elements of the device are not shown.

The light shield film 5, 105 on the TFT substrate is usually made of electrically conductive material such as a metal film or a semiconductor film in order to achieve a light shield effect.

However, it has the following two problems to use conductive material as the light shield film.

First, the conductive material, together with the drain electrode and the source electrode, generates parasitic capacitance.

The parasitic capacitance allows signals on the image signal line to pass through the drain electrode - (parasitic capacitance) - light shield film - (parasitic capacitance) - source electrode - pixel electrode, even when the TFT is in off state, causing voltage fluctuation of the pixel electrode, generating luminance irregularity and cross talk on the display, and degrading display quality.

In order to reduce cross talk, Japanese Patent Laid-Open No. Show 64-42634, for example, proposes a structure which contains separate pieces of light shield metal film. Japanese Patent Laid-Open No. Show 62-172758 proposes a technology to use a light shield film made of semiconductor. According to these technologies, parasitic capacitance is reduced a little, but is apparently larger than configurations formed without a light shield film.

A second problem is that the light shield film is charged, fluctuating the operating voltage of the TFT and causing display irregularity.

In order to prevent this electric charge, Japanese Patent Laid-Open No. Show 62-276031 proposes a structure of which a light shield film is connected to a scan signal line or a image signal line. In this structure, however, parasitic capacitance increases larger than a structure of which a light shield film is not connected to these lines.

Other technologies which uses a light shield film made of insulating resin are disclosed in Japanese Patent Laid-Open No. Hei 3-123320 and No. Hei 4-86809. However, these technologies have a problem that, because insulating resin can not be formed very thin, the accuracy of the thickness of a film and patterning is poor, and consequently, they get only a poor display quality.

BRIEF SUMMARY OF THE INVENTION

It is an object of the present invention to provide an active matrix liquid-crystal display apparatus with improved display quality.

It is a further object of the present invention to prevent voltage fluctuation of the pixel electrode, and luminance irregularity and cross talk on the display to prevent increasing the parasitic capacitance of the light shield film.

It is a further object of the present invention to prevent the light shield film from electrically charging, and thus, to prevent operating voltage fluctuation and display irregularity.

It is a further object of the present invention to provide an active matrix liquid-crystal display apparatus which can be easily manufactured and has a good display quality.

To achieve these objects, the inventive active matrix liquid-crystal display apparatus provides compensating the parasitic capacitance with capacitance between the pixel electrode and the adjacent image signal line. When two adjacent image signal lines are in opposite phase, modulation noises from the adjacent two image signal lines offsets each other and voltage fluctuation caused by the light shield film is offset by voltage fluctuation caused by the compensatory capacitance. When a positive electric voltage and a negative electric voltage are applied alternately to adjacent pixels along the scan signal line from a pixel to a pixel, the adjacent image signal lines are kept always in opposite phase to each other, and the modulation noises from adjacent two image signal lines are always offset by each other.

The above-mentioned compensatory capacitance is provided so that it becomes approximately equal to parasitic capacitance caused by the light shield film. The compensatory capacitance film can be formed at the same time that the gate electrode or the light shield film is formed, by using the same material as the gate electrode or the light shield film. It can be fabricated adding no step to a conventional production process. If the parasitic capacitance is increased by misalignment of a pattern or by a change in the thickness of the passivation film, the compensating capacitance increases at the same time. In this way, fabricating errors can be compensated.

BRIEF DESCRIPTION OF THE DRAWINGS

The above-mentioned and other objects, features, and advantages of the present invention will become more apparent from the following detailed description when taken in conjunction with the accompanying drawings, wherein.

DETAILED DESCRIPTION OF THE PREFERRED EMBODIMENTS

Embodiment 1

Figure 4:
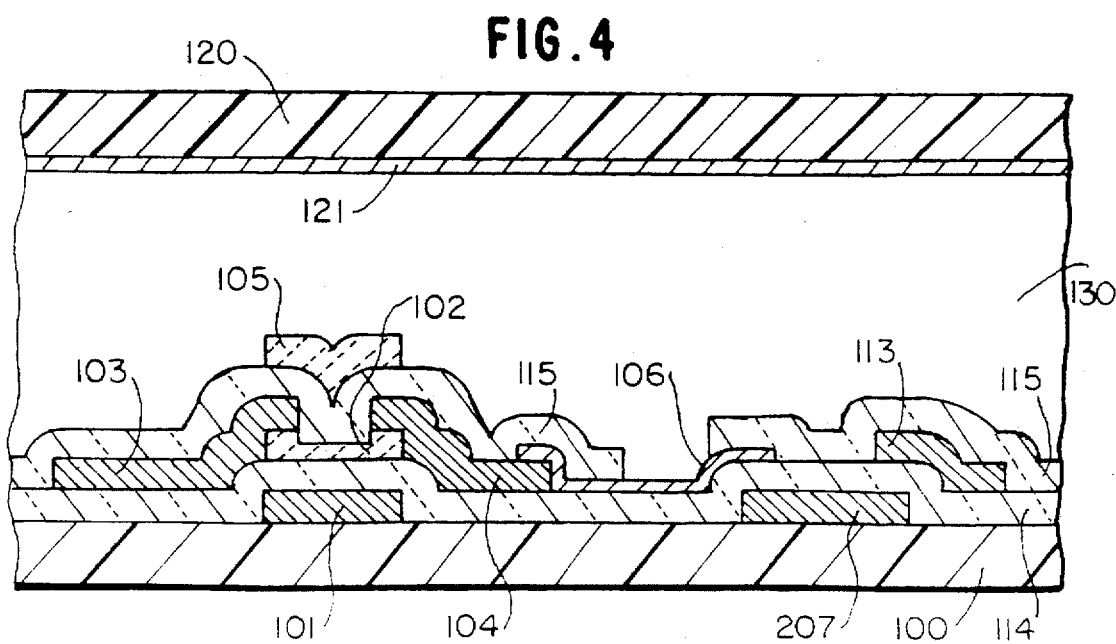
FIG. 4 is a sectional view of the A–A' section in FIG. 3.

An embodiment of the present invention will be described with reference to FIG. 4. A gate electrode 101 and capacitance film 207 are patterned on the glass substrate 100, then gate insulating film 114 and semiconductor film 102 are added in this order. Then, a drain electrode 103, a source electrode 104, an image signal line 113, and a pixel electrode 106 are formed on them. Then a passivation film 115 and a light shield film 105 are added to complete a thin-film transistor (TFT) substrate.

The counter substrate is fabricated by forming a counter electrode 121 on a glass substrate 120.

Finally, the TFT substrate and the counter substrate are coated with orientation films (not shown), then, orientation treatment are applied to it. After seal patterns are formed, the substrates are put together, burnt, then liquid crystal 130 is poured between them. They are then sealed to complete a liquid-crystal display device.

Although any conductive material can be used as the capacitance film 207, in this embodiment the capacitance film 207 is made of the same material as the gate electrode so they are patterned at one time.

Figure 1:
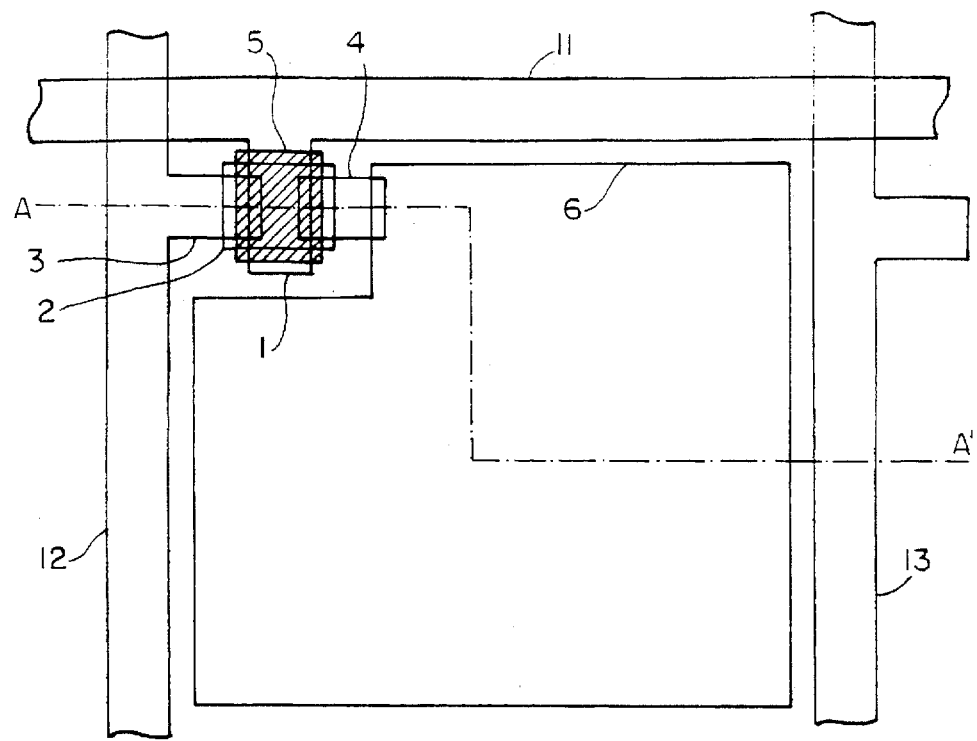
FIG. 1 is a plan view of an active matrix liquid-crystal display apparatus to a prior art.
Figure 2:
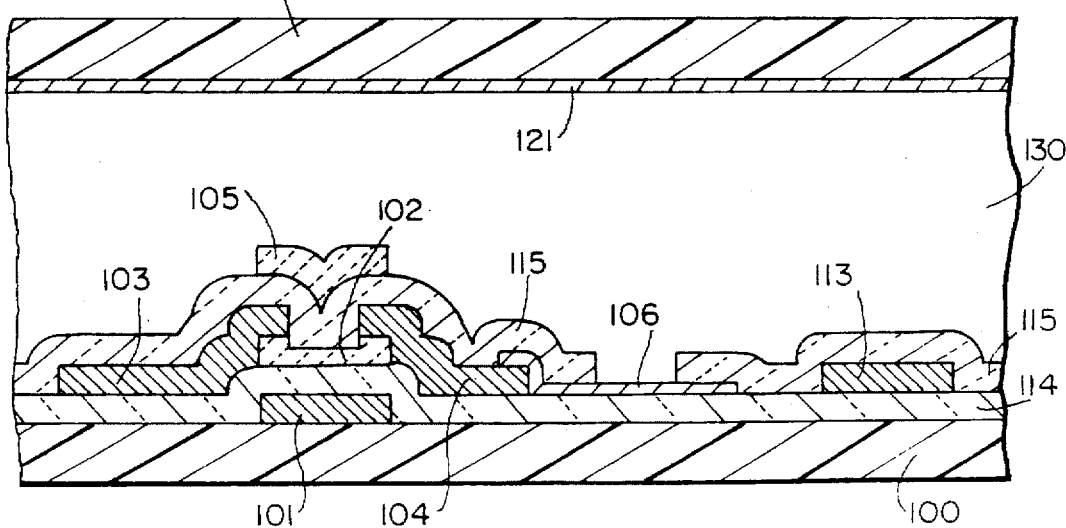
FIG. 2 is a sectional view of the A–A' section in FIG. 1.
Figure 3:
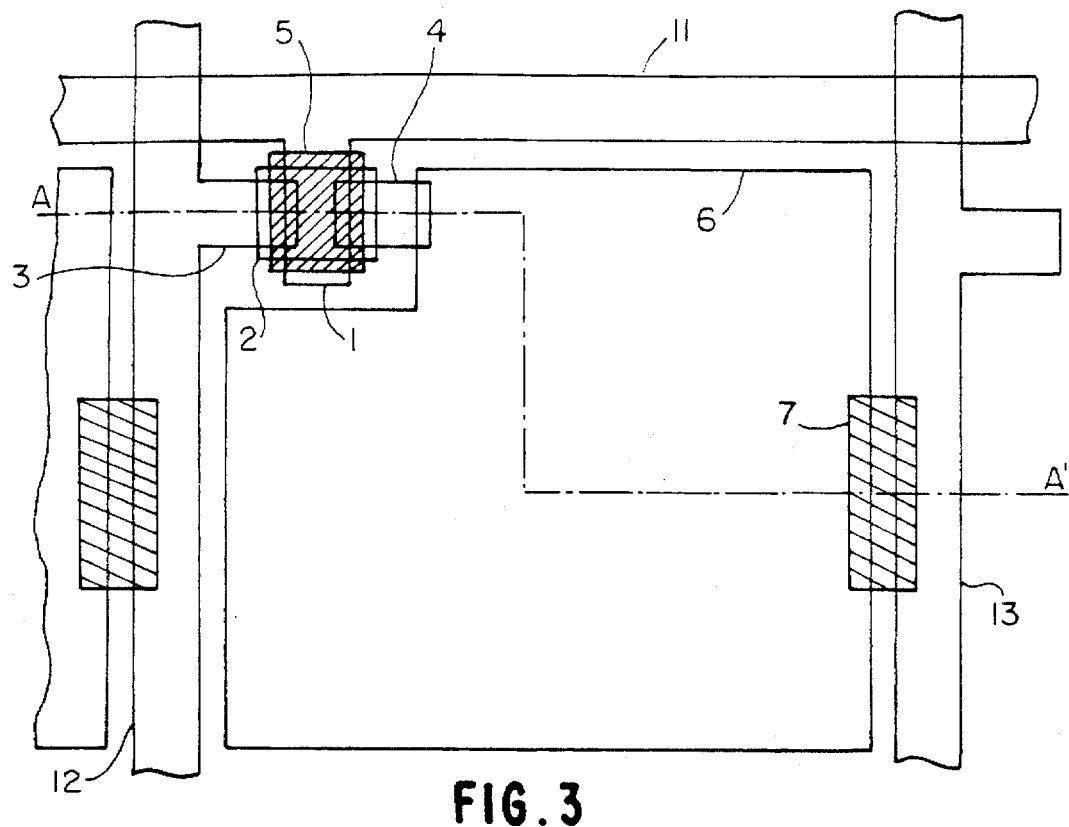
FIG. 3 is a sectional view of a first embodiment of an active matrix liquid-crystal display apparatus of the present invention.

The size of the capacitance film 207 is determined so that parasitic capacitance caused by the light shield film 5 shown in FIG. 3 and compensator capacitance caused by the capacitance film 7 become approximately the same.

As shown in FIG. 3, the capacitance film 7 is spread along the elongated side of the image signal line 13 in such a manner that it has overlapping portions with the pixel electrode 6 and the adjacent image signal line 13. The area of the capacitance film 7 is determined according to compensator capacitance to be provided.

Figure 5:
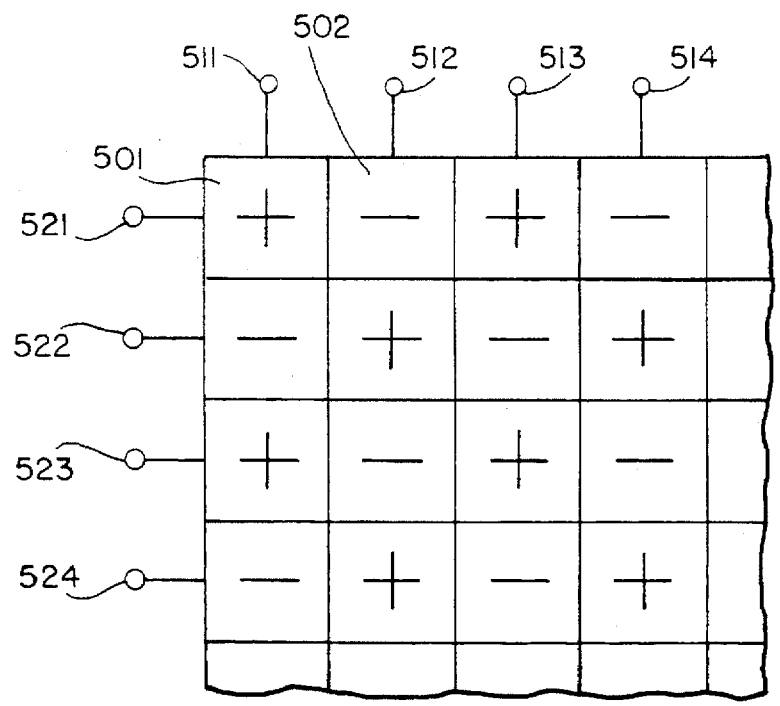
FIG. 5 is a sectional view of the pixel voltage pattern of the inventive active matrix liquid-liquid crystal display apparatus.

The driving circuit attached to the liquid-crystal display device employs a dot inverse drive method, which, as shown in FIG. 5, supplies signals to each image signal lines 511, 512, 513, 514 so that a positive electric voltage and a negative electric voltage are applied alternately to the adjacent pixels 501, 502 connected with scan signal lines 521, 522, 523, 524. When the two adjacent pixels have the same color tone,, the parasitic capacitance is offset by the compensator capacitance by applying a positive electric voltage to one capacitance and a negative electric voltage to the other. When the adjacent pixel have different color tones, voltage of the parasitic capacitance and voltage of the compensator capacitance differ from each other, but it does not cause a problem. A source line inverse method, which inverses the electric voltage applied to pixels on line by line basis, can also be used according to the same principle.

This embodiment of the liquid-crystal display apparatus is thus completed.

With reference to FIG. 3, the operation of this embodiment of the liquid-crystal display of the present invention is described below.

A change in the voltage of the image signal line 12 is applied to the pixel electrode 6 as a modulation noise via parasitic capacitance caused by the light shield film 5. At the same time, a change in the voltage of the adjacent image signal line 13 is applied to the pixel electrode 6 as a modulation noise via compensating capacitance caused by capacitance film 7.

In the dot inverse drive method, the voltage change on the image signal line 12 and that on the adjacent image signal line 13 are of opposite polarity, that is, they are in opposite phase. Therefore, the modulation noises from the two image signal lines 12, 13 are in opposite phase and are nullified by each other in the pixel electrode 6.

In this way, voltage fluctuation in the pixel electrode 6 is reduced and luminance irregularity and cross talk are avoided.

Embodiment 2

Figure 6:
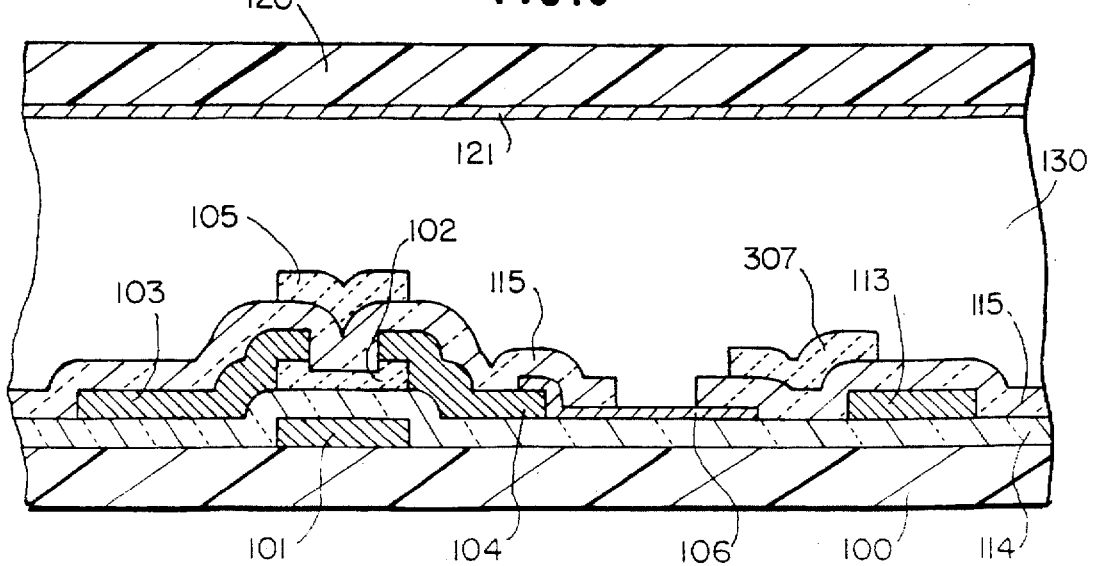
FIG. 6 is a second embodiment of an active matrix liquid-crystal display apparatus of the present invention.
Figure 7:
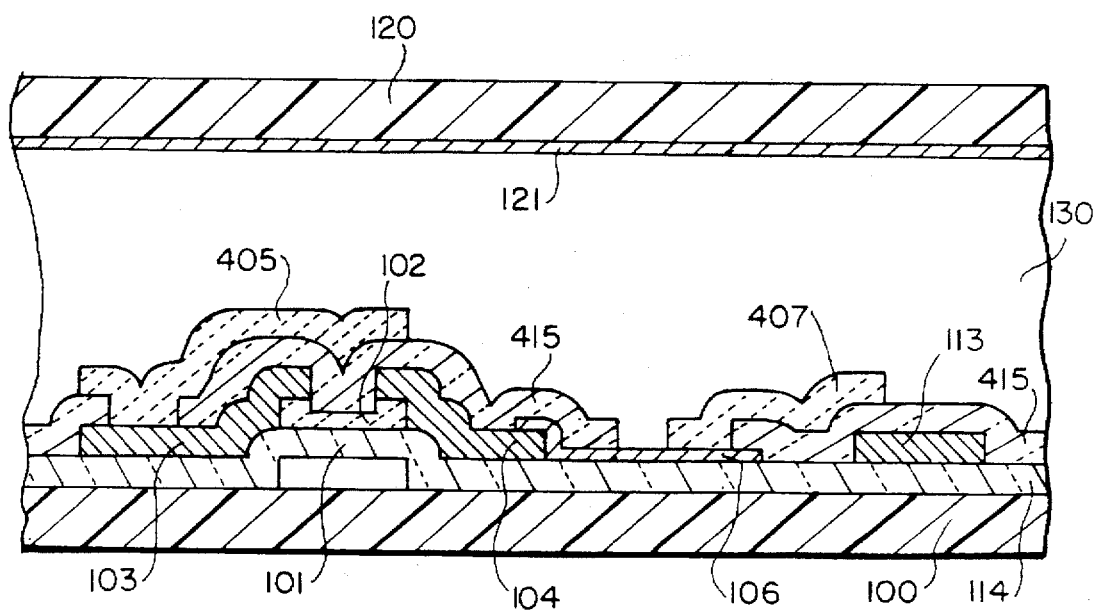
FIG. 7 is a third embodiment of an active matrix liquid-crystal display apparatus of the present invention.

FIG. 6 shows a cross-section of a second embodiment of the liquid-crystal display apparatus of the present invention. The plan view of this embodiment is the same as that of the first embodiment.

The liquid-crystal display apparatus of this embodiment is fabricated in the same way as the above-mentioned prior art up to the step in which passivation film 115 is formed. After the passivation film is formed, light block film 105 and capacitance film 307 are formed.

Although any conductive material can be used as the capacitance film 307, in this embodiment the capacitance film 307 is made of the same material as the light block film and they are patterned at one time.

The drive circuit uses the dot inverse drive method or the source line inverse method, as in the first embodiment.

In the first embodiment, parasitic capacitance by the light shield film and compensator capacitance by the capacitance film are generated from different layers. The former is generated from passivation film 115 and the latter from gate insulating film 114.

In the second embodiment, on the other hand, the capacitance film 307 is formed on the same layer as the light shield film 105 and the passivation film 115 acts as a common inductive layer. The capacitance film and the light shield film are made of same material. This structure has an advantage that compensator capacitance changes in such a manner that it nullifies a parasitic capacitance change caused by misalignment of a pattern or a change in the thickness of the passivation film. Another advantage is that the compensator capacitance and the parasitic capacitance by the light shield film can be easily equalized with each other since the thickness of the passivation film 115 is equal. The two capacitance values are equalized by making the area where the light shield film 105, source electrode 104, and drain electrode 103 overlap with each other approximately the same in size as the area where the capacitance film 307, pixel electrode 106, and image signal line 113 overlap with each other. Strictly, the area of the capacitance film 307 may be slightly larger than that of the light shield film 105 since the parasitic capacitance of the light shield film 105 is affected by semiconductor film 102.

The liquid-crystal display apparatus of this embodiment is fabricated in the same way as the above-mentioned prior art up to the step in which the pixel electrode 106 is formed. After this step, a contact hole is formed in the image signal line (i.e. drain electrode 103) when the passivation film 415 is patterned. Then light block film 405 and the capacitance film 407 are formed so that the capacitance film 407 connects with the pixel electrode 106.

The drive circuit employs the above-mentioned dot inverse drive method.

In this embodiment, the light shield film 405 is electrically connected with the image signal line (drain electrode 103) to prevent the light shield film 405 from being charged. As a result, parasitic capacitance increases. However, this embodiment has an advantage that it can increase compensator capacitance as the parasitic capacitance increases, without expanidng the area of the capacitance film 407, by connecting the capacitance film 407 electrically with the pixel electrode 106. The capacitance film 407 may be connected with the image signal line 113, instead of the pixel electrode 106.

As described above, according to the present invention, voltage fluctuation of the pixel electrode caused by the light shield film is reduced by forming capacitance film and providing compensator capacitance between the pixel electrode and the adjacent image signal line. Thus luminance irregularity and cross talk are reduced and display quality can be improved substantially.

According to the present invention, the above-mentioned advantages can, of course, be achieved when the capacitance film is formed in a conductive layer below the image signal line. Especially, the present invention has an advantage in terms of production process that, if the capacitance film is formed using the same material as the gate electrode, the capacitance film and gate electrode can be patterned at one time.

According to the present invention, the capacitance film made of the same material as the light film provides, in addition to the advantage that the capacitance film and light block film can be patterned at a time, an advantage that a change of compensator capacitance offsets a change of parasitic capacitance caused by misalignment of a pattern or a change of thickness of the passivation film, since the capacitance film is formed on the same layer as the light shield film and the passivation film works as a common inductive layer.

In addition, the present invention reduces voltage fluctuation in the pixel electrode caused by increase of parasitic capacitance, even when the light shield film is connected with an image signal line or a scan signal line to prevent the light shield film being charged. The present invention has an advantage that compensator capacitance can be increased without expanding the area of capacitance film in proportion to increase of parasitic capacitance caused by connecting the capacitance film with a pixel electrode or an image signal line.

What is claimed is:

1. A liquid-crystal display apparatus comprising:

a substrate;

a first scan signal line formed over said substrate;

a first data signal line formed over said substrate and crossing said first scan signal line;

a first switching element formed over said substrate and having a gate electrode connected to said first scan signal line, a first electrode connected to said first data signal line and a second electrode;

a pixel electrode formed over said substrate and connected to said second electrode of said switching element;

a second data signal formed over said substrate in parallel to said first data signal adjacently to said pixel electrode;

a light shielding layer covering said switching element; and a compensation capacitor formed to capacitance-couple said pixel electrode with said second data line;

wherein said compensation capacitor includes a conductive layer having a first portion overlapping with a part of said pixel electrode and a second portion overlapping with a part of said second data line, said conductive layer being formed over said pixel electrode and said second data line with an intervening dielectric film and made of the same material as said light shielding layer; and said conductive layer has an end part connected to said pixel electrode through a first contact hole provided in said dielectric film, and said light shielding layer has an end part connected to said first electrode through a second contact hole provided in said dielectric film.

* * * * *